(12) United States Patent
Cheah et al.

(10) Patent No.: US 6,778,026 B2
(45) Date of Patent: Aug. 17, 2004

(54) HIGH-SPEED PHASE FREQUENCY DETECTION MODULE

(75) Inventors: Jonathon Cheah, San Diego, CA (US); Christopher Yong, San Diego, CA (US); Minjie Wu, Singapore (SG)

(73) Assignee: Microtune (San Diego), Inc., San Diego, CA (US)

( * ) Notice: Subject to any disclaimer, the term of this patent is extended or adjusted under 35 U.S.C. 154(b) by 0 days.

(21) Appl. No.: 10/053,480

(22) Filed: Jan. 15, 2002

(65) Prior Publication Data

US 2003/0132804 A1 Jul. 17, 2003

(51) Int. Cl.[7] .............................................. H03L 7/00
(52) U.S. Cl. ...................... 331/17; 331/1 M; 327/156; 375/374
(58) Field of Search ..................... 331/1 M, 25, 17; 327/156, 157, 159; 375/374, 375, 376

(56) References Cited

U.S. PATENT DOCUMENTS

| | | | |
|---|---|---|---|
| 5,963,059 A | 10/1999 | Partovi et al. ................ 327/12 |
| 6,121,846 A | 9/2000 | Ahola et al. ................ 331/27 |
| 6,181,210 B1 | 1/2001 | Wakayama | |
| 6,215,363 B1 * | 4/2001 | Conta et al. ................ 331/17 |
| 6,301,318 B1 | 10/2001 | Wei et al. ................ 375/371 |
| 6,320,470 B1 * | 11/2001 | Arai et al. ................ 331/17 |
| 6,346,861 B2 * | 2/2002 | Kim et al. ................ 331/8 |
| 6,433,596 B1 * | 8/2002 | Bossard ................ 327/157 |
| 2001/0052822 A1 | 12/2001 | Kim et al. ................ 331/8 |

FOREIGN PATENT DOCUMENTS

| | | | |
|---|---|---|---|
| EP | 0 500 014 A2 | 2/1992 | ........... H03L/7/089 |
| WO | WO 97/15116 | 4/1997 | ........... H03K/3/356 |

OTHER PUBLICATIONS

PCT Search Report for PCT/US 03/00689, 4 pages, Oct. 8, 2003.

Hirad Samavali, Hamid R. Rateghm, Thomas H. Lee, ISSCC 2001/Session 13/Wireless LAN 13.7, 2001 IEEE International Solid–State Circuits Conference.

* cited by examiner

*Primary Examiner*—Henry Choe
(74) *Attorney, Agent, or Firm*—Baker Botts L.L.P.

(57) ABSTRACT

A high-speed phase-frequency detection module is described to function at very high frequencies and to produce very low jitter. In one embodiment, high-speed phase-frequency detection module includes a PFD with edge-triggered asynchronous-reset true-single-phase-clocking ("TSPC") D flip-flops that have very short CLK to Q and Reset to Q time delays. In one embodiment, the high-speed phase-frequency detection module includes a charge pump, without replica or feedback, that can respond to the very narrow pulses from the PFD and produce output voltages with small ripple, thus leading to low VCO output jitter.

30 Claims, 10 Drawing Sheets

Ideal PFD

PFD with dead zone

PFD with finite pulse width

HIGH-SPEED PHASE FREQUENCY DETECTION MODULE

FIELD OF THE INVENTION

The present invention relates generally to the field of high frequency data transmission systems and, more specifically, to phase-lock-loops, synthesizers, and high-speed phase frequency detection devices.

BACKGROUND OF THE INVENTION

As wireless communication devices increase in number and complexity, there is an ever increasing need for wireless communication devices and systems that can function at very high frequencies. To this end, high-speed phase-frequency detection devices that can handle higher frequencies are needed.

Typically, phase-frequency detection devices are used in phase-lock-loops. A phase-lock-loop compares the phase and/or frequency of a generated clock signal (or more often a divided version of it) to that of a pure reference clock signal of known accurate frequency and adjusts the frequency and phase of the generated clock signal until it is "locked" in both frequency and phase to the reference clock signal. Thus, a clock signal of a high frequency that is a multiple of the reference frequency is established, which becomes the base for high-frequency wireless communication systems.

FIG. 1A is an illustration of a typical phase-lock loop 100. It includes a phase-frequency detector ("PFD") 102, a charge pump 104, a voltage controlled oscillator ("VCO") 106, a loop filter 108, and most often a divider 110. The PFD 102 compares the phase and frequency of a reference clock signal (Reference Clock) to a feedback clock signal (Feedback Clock). The Feedback Clock signal is generated by the divider 110, which divides down from the VCO 106 output (Output Clock). If the Feedback Clock and the Reference Clock are out of phase, the PFD 102 will generate corrective voltage signals (Vup or Vdown) to trigger the charge pump 104 to either source current into (Iup) or sink current from (Idown) the loop filter 108, hence increase or decrease the control voltage (Vcntl) going into VCO 106. The control voltage drives the frequency of the clock signal higher or lower, until the clock signal and the reference signal are matched in phase and frequency, or "locked." When the loop locks, the charge pump 104 should stops sourcing or sinking current, thus leaving the control voltage relatively constant.

However, even when locked, the PFD 102 may experience jitter, or small noise error, in what is known as the "dead zone," depicted in FIG. 1B. Jitter as a result of dead zone occurs when the Feedback Clock signal varies slightly from the Reference Clock signal and very small phase differences develops (Δφ). When the phase difference is slight enough, finite rise and fall times of the PFD pulse signals, caused by circuit-element capacitance, may not find enough time to reach a good logic high level, hence failing to turn on/off the charge pump current switches. This leads to random variation in the VCO 106 output, or jitter.

One solution to eliminate jitter in the dead zone is to generate overlapping reset pulses, with wide enough pulse widths, to turn on/off the charge pump switches, also shown in FIG. 1B.

FIG. 1C shows the input-output characteristic of the ideal PFD, PFD with dead zone, and PFD with a reset pulse. Generally, when overlapping reset pulses are too wide, more information of phase relationship is lost, which affects the performance of the phase-lock-loop system. Thus, the reset pulse has to remain narrow, compared to the period of the clock signals, to achieve good loop dynamics.

Many communication systems today are operated at very high frequencies, such as the 5.18 GHz to 5.805 GHz frequency spectrum used for the, 802.11a standard. Unfortunately, current phase-lock-loop devices, such as PFDs (see FIG. 1D) and charge pumps (see FIG. 1E), are too slow and thus cannot create corrective pulses and control voltages for very high frequencies. In addition, current charge pumps, like the one shown in FIG. 1E, require complicated feedback and replica circuit to function properly. Such excessive circuitry add complexity to the circuit design and cause instability when used at high frequencies.

SUMMARY OF THE INVENTION

A high-speed phase-frequency detection module is described to function at very high frequencies and to produce very low jitter. In one embodiment, high-speed phase-frequency detection module includes a PFD with edge-triggered asynchronous-reset true-single-phase-clocking ("TSPC") D flip-flops that have very short CLK to Q and Reset to Q time delays. In one embodiment, the high-speed phase-frequency detection module includes a charge pump, without replica or feedback, that can respond to the very narrow pulses from the PFD and produce output voltages with small ripple, thus leading to low VCO output jitter. Other features of the present invention will be apparent from the accompanying drawings and from the detailed description that follows.

BRIEF DESCRIPTION OF THE DRAWINGS

The present invention is illustrated by way of example and not limited by the figures of the accompanying drawings in which like references indicate similar elements and in which.

DETAILED DESCRIPTION OF THE INVENTION

Described herein is a high-speed phase-frequency detection module. In the following description numerous specific details are set forth in order to provide a thorough understanding of the present invention. One of ordinary skill in the art, however, will appreciate that these specific details are not necessary to practice the present invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Figure 1A:
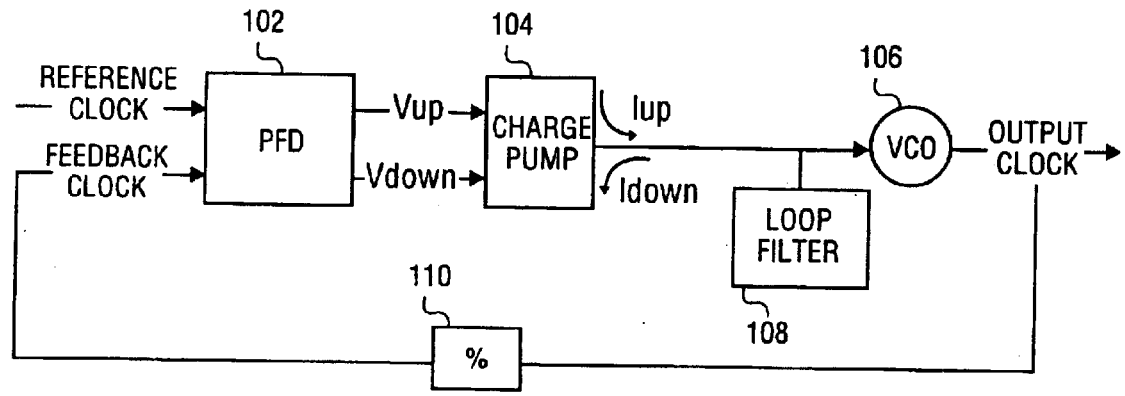
FIG. 1A is an illustration of a conventional phase-lock loop.
Figure 1B:
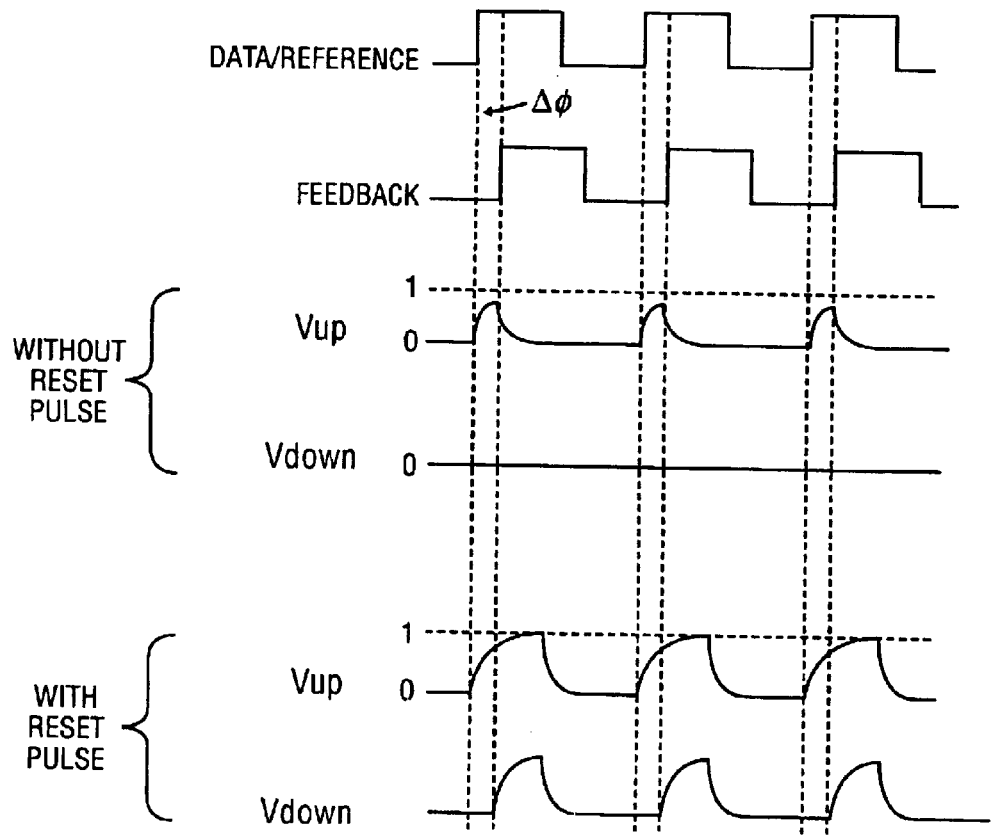
FIGS. 1B–C are a graphical illustration describing deadzone, the corrective measures and its consequence.
Figure 1C:
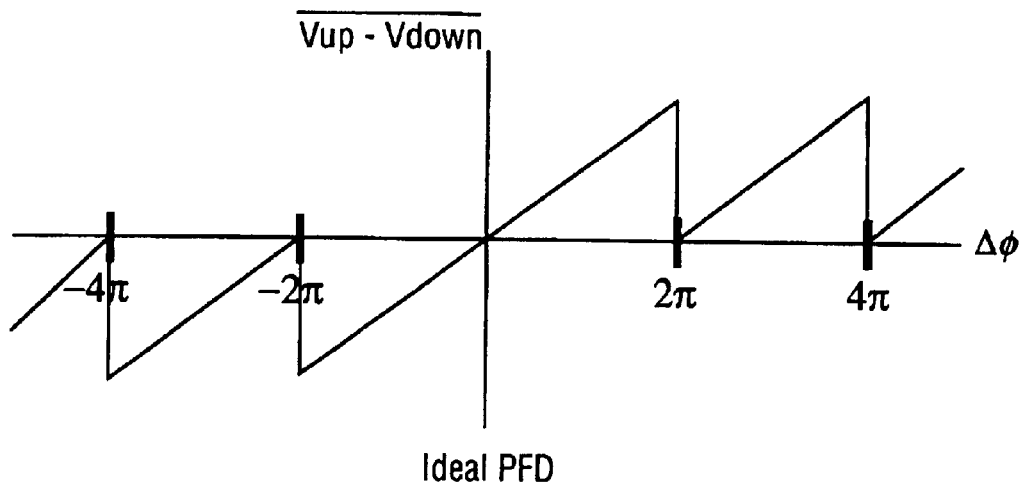
Figure 1C:
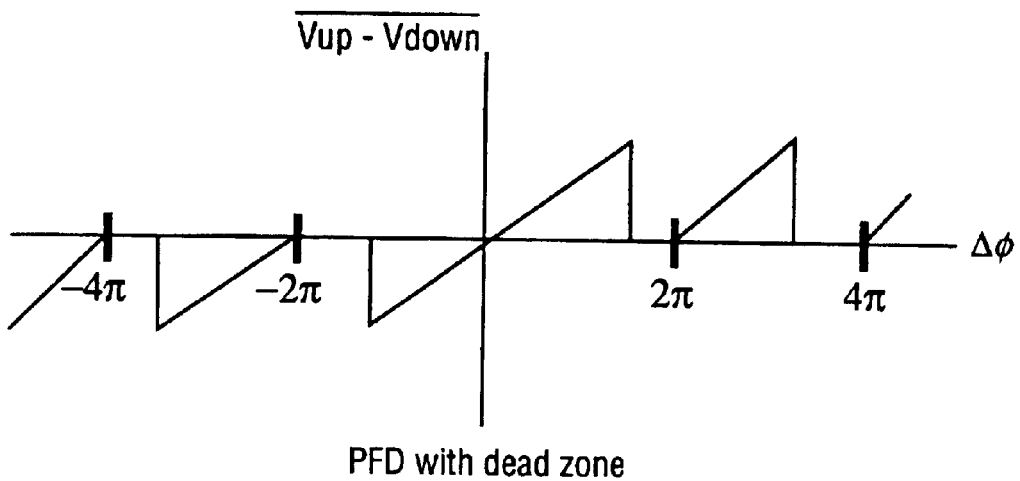
Figure 1C:
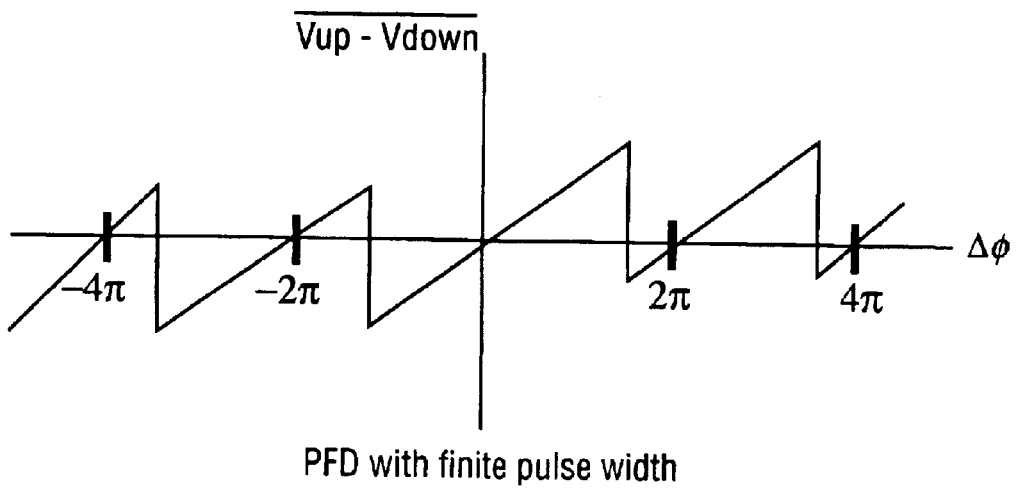
Figure 1D:
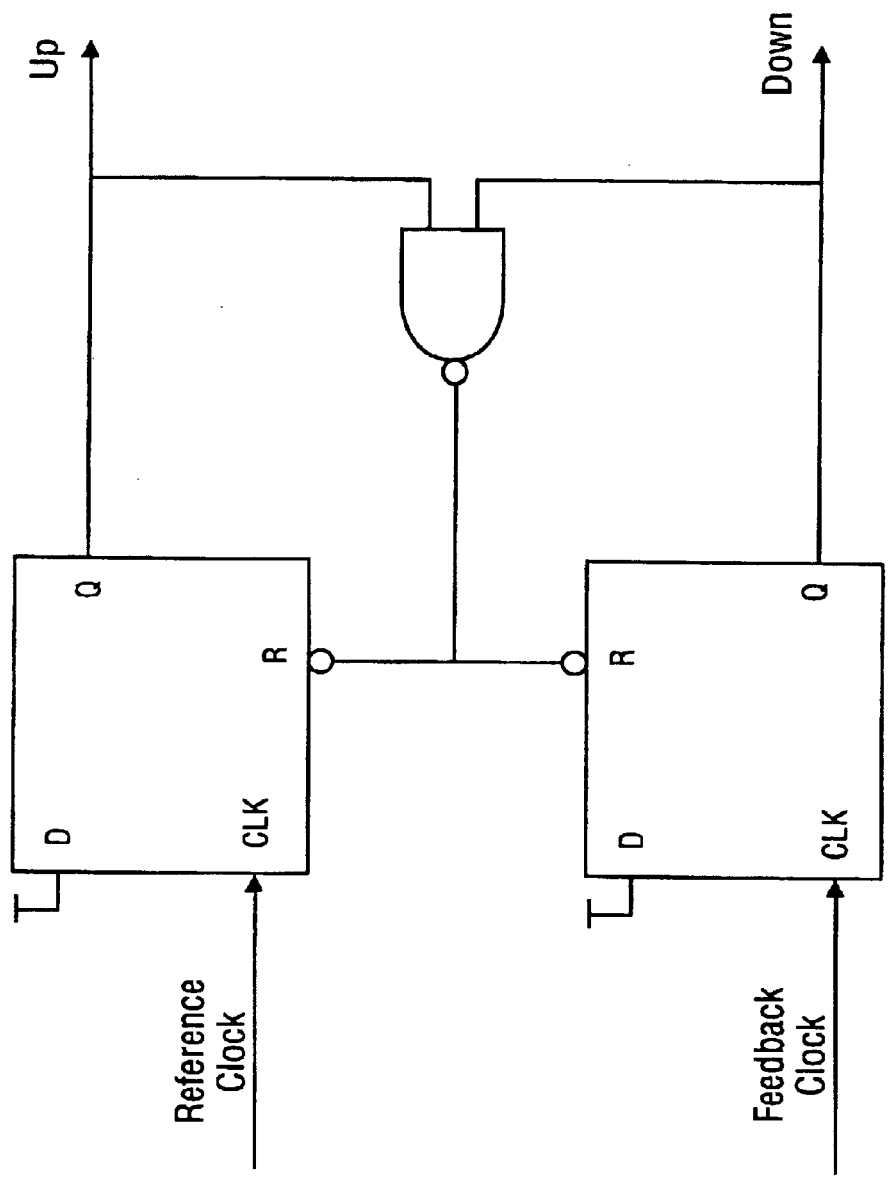
FIG. 1D is an illustration of a conventional PFD.
Figure 1E:
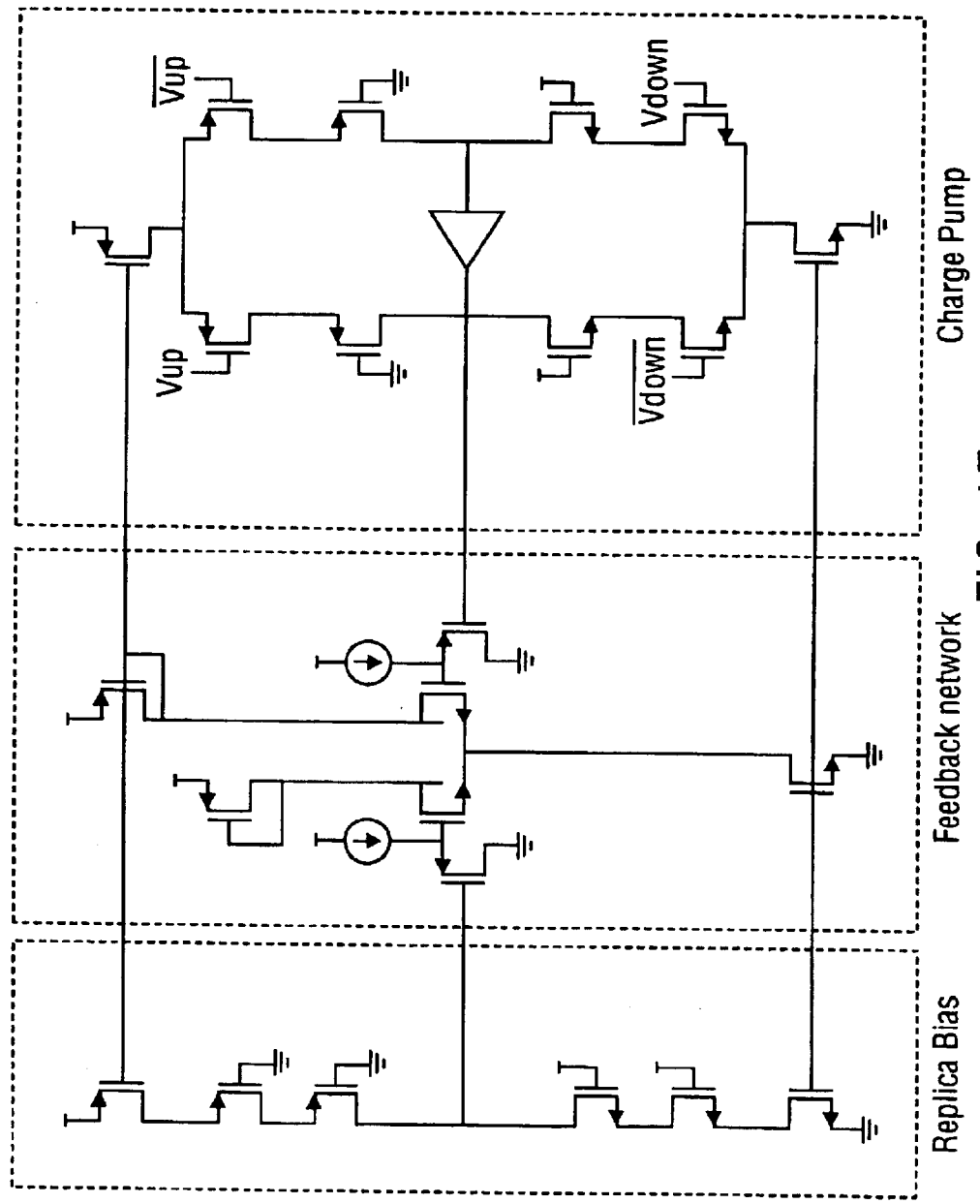
FIG. 1E is an illustration of a conventional charge-pump.
Figure 2:
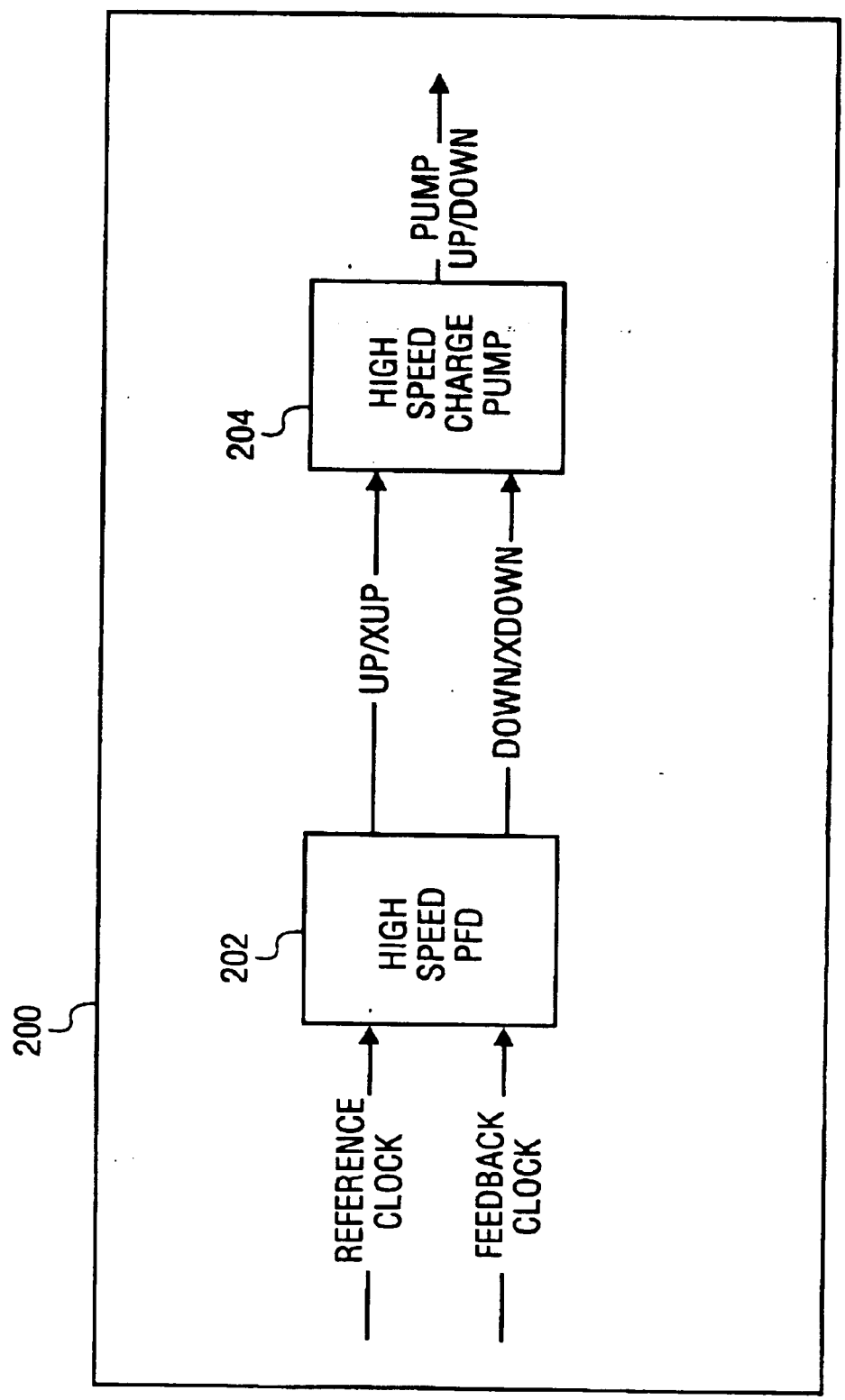
FIG. 2 is an illustration of one embodiment of a high-speed phase-frequency detection module 200 configured according to the present invention.

FIG. 2 is a diagram of a high-speed phase-frequency detection module 200 configured according to the present invention. The high-speed phase-frequency detection module 200 includes a high-speed PFD 202 and a fast-reacting charge pump 204. The high-speed PFD 202 includes a first input to receive a very high frequency Reference Clock signal and a second input to receive a Feedback Clock signal. The high-speed PFD 202 is configured to compare the phase and/or frequency difference of the Feedback Clock signal and the Reference Clock signal and produce voltage pulses on its outputs (UP/XUP and DOWN/XDOWN). The voltage pulses are received by the high-speed charge pump 240, which is configured to provide corrective currents (PUMP up/down). Further details of the high-speed PFD 202 are discussed in conjunction with FIG. 3. Further details of the charge pump are discussed in conjunction with FIG. 5.

Figure 3:
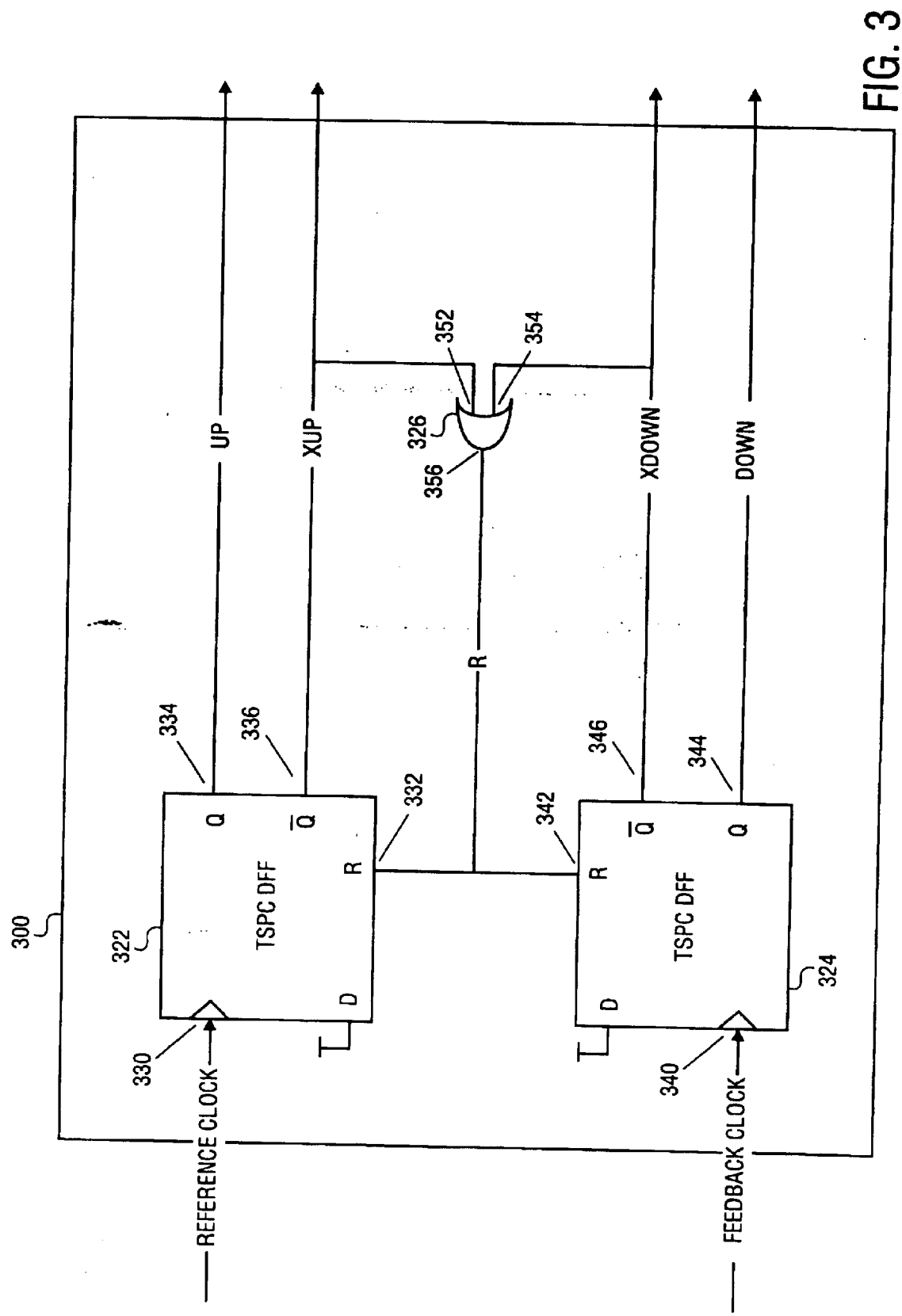
FIG. 3 is an illustration of one embodiment of a high-speed PFD 300 configured according to the present invention.

FIG. 3 is a diagram of one embodiment of a high-speed PFD 300 configured according to the present invention. It includes two edge-triggered asynchronous-reset TSPC D flip-flops ("TSPC DFF") 322 and 324, and an OR gate 326. TSPC DFFs 322 and 324 are configured to provide very short CLK to Q and Reset to Q delays, as low as sub-100 ps. An exemplary embodiment of the TSPC DFFs 322 and 324 is described in conjunction with FIG. 4.

The first TSPC DFF 322 has a first input 330 to receive the Reference Clock signal, a second input 332 to receive a reset signal (R), and outputs 334 and 336 to produce output signals (UP and XUP, where XUP is the inverse of UP). The second TSPC DFF 324 has a first input 340 to receive the Feedback Clock signal, a second input 342 to receive a reset signal (R), and outputs 344 and 346 to produce output signals (DOWN and XDOWN, where XDOWN is the inverse of DOWN).

The TSPC DFFs 322 and 324 are configured to compare the Reference Clock signal and the Feedback Clock signal to determine if they match phase or frequency. If the phase of the Reference Clock signal leads that of the Feedback Clock signal, then the first TSPC DFF 322 will produce a first voltage signal (i.e. UP/XUP), and send it to the charge pump. If the phase of the Reference Clock signal lags that of the Feedback Clock signal, then the second TSPC DFF 324 will produce a second voltage signal (i.e. DOWN/XDOWN), and send it to the charge-pump.

The OR gate 326 includes a first input 352 to receive the data output signal XUP from TSPC DFF 322, a second input 354 to receive the output signal XDOWN from TSPC DFF 324, and a reset output 356 to produce a reset output signal (R).

In one embodiment, all of the TSPC DFF outputs (UP/XUP and DOWN/XDOWN) are brought out to interface with charge pump without additional inverting logic. For the high-speed PFD 300 to function at high speeds, it is advantageous to not have inverting logic because it is too slow. At very high frequencies the pulse widths of the TSPC DFF output signals (UP/XUP and DOWN/XDOWN) are very narrow, and any additional inverter delay can slow them down. Additionally, any digital logic processing can slow down the output signals. Hence, in one embodiment, no digital processing logic operates on the TSPC DFF output signals between the high-speed PFD 300 and the subsequent charge-pump. Small static CMOS transistors are used to perform the inverted logic within the TSPC DFFs 322 and 324. The CMOS logic is very fast and power efficient. The high-speed PFD 300 can produce reset pulses with widths as small as 200 ps.

Figure 4:
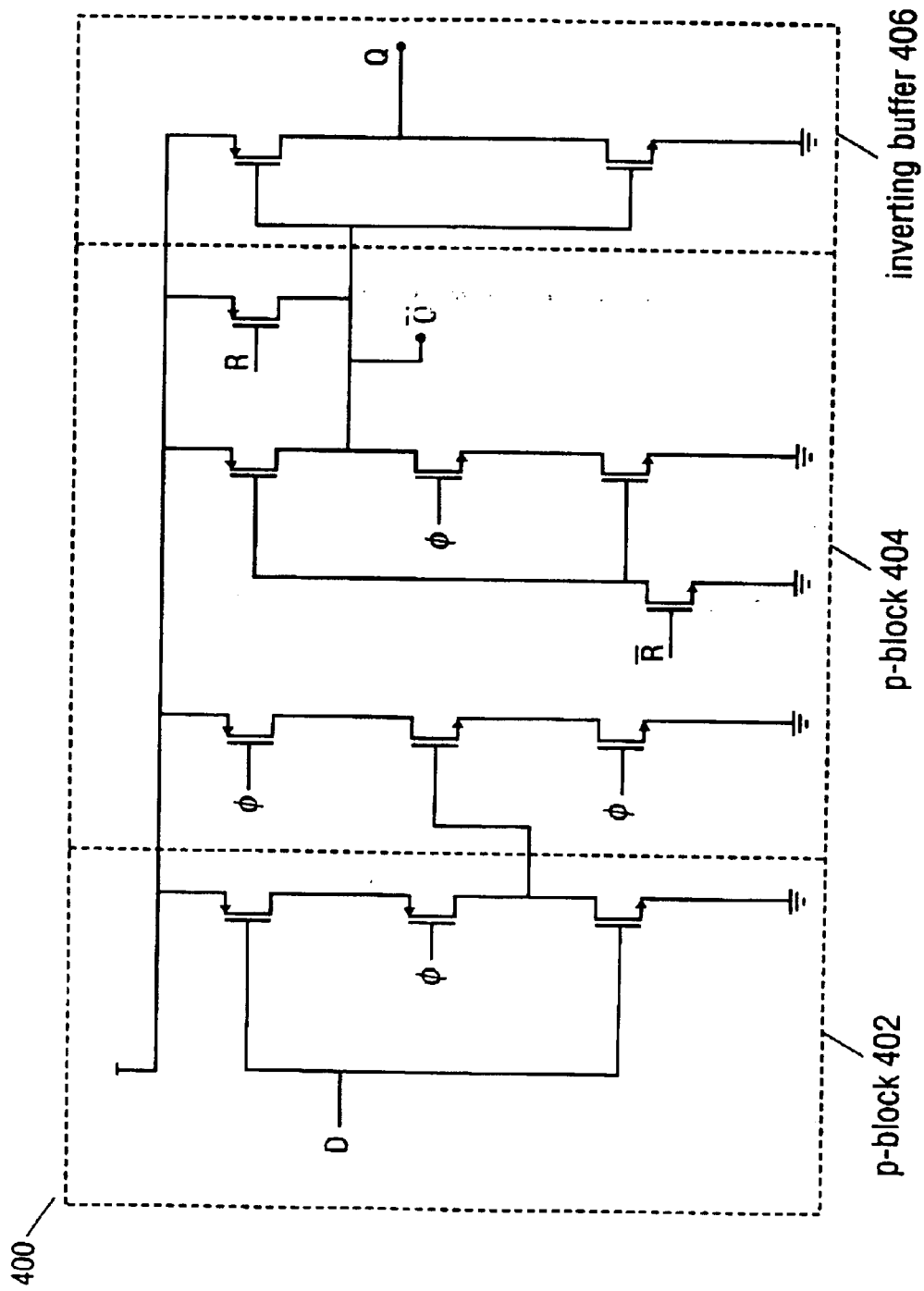
FIG. 4 is an illustration of one embodiment of a high-speed, edge-triggered asynchronous reset TSPC D-flip-flop 400 configured according to the present invention.

FIG. 4 is an illustration of an exemplary high-speed, edge-triggered asynchronous reset TSPC DFF 400 configured according to the present invention. TSPC DFF 400 includes a P-precharged Domino logic gate ("p-block") 402, followed by an n-precharged Domino logic gate ("n-block") 404, followed by an inverting buffer 406. The p-block does not include an inverting clock latch, but the n-block does. The p-block and n-block are clocked, hence only the input and output of the clocked latch of n-block requires resetting. Consequently, TSPC DFF 400 can provide very short CLK to Q and Reset to Q delay, as low as sub-100 ps.

Figure 5:
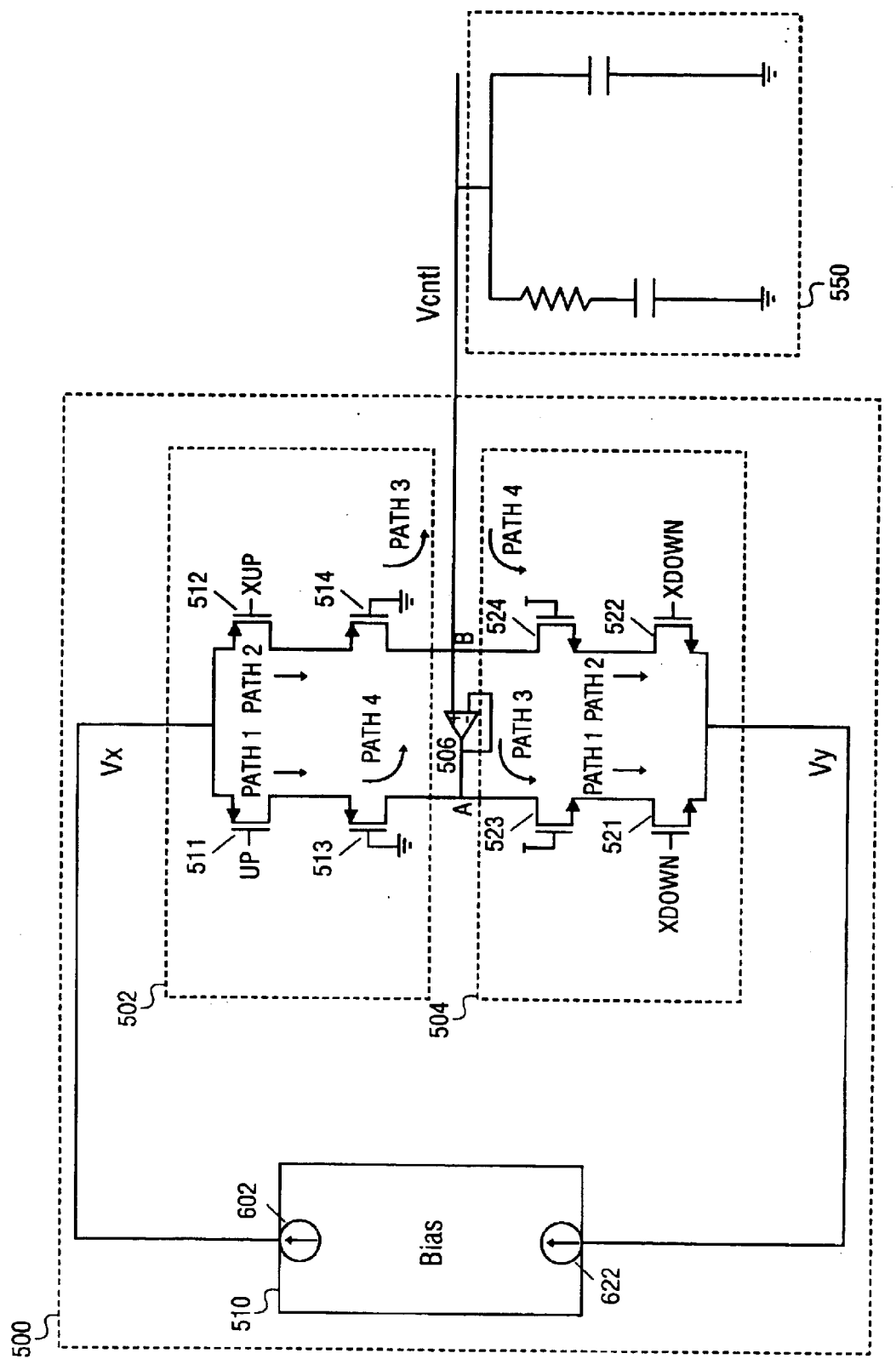
FIG. 5 is an illustration of one embodiment of a high-speed charge-pump 500, according to the present invention.

FIG. 5 is a diagram of one embodiment of a high-speed charge-pump 500, according to the present invention. Referring to FIG. 5, the charge-pump 500 includes an upper current branch 502 to source a positive current pulse. In one embodiment, the upper current branch consists of a plurality of PMOS transistors 511–514. The charge-pump 500 also includes a lower current branch 504 to sink a negative current pulse. In one embodiment, the lower current branch 504 consists of a plurality of NMOS transistors 521–524.

The lower current branch 504 is connected to the upper branch 502 at two nodes, A and B. The output currents can be summed together by shorting at node B. An amplifier 506 is connected between the two nodes A and B.

The charge-pump 500 further includes a bias circuit 510, with current sources that are continuously on, coupled to the upper and lower current branches 502 and 504. An advantage of charge-pump 500 is that it does not utilize a feedback circuit or replica circuit, thus allowing the charge-pump 500. With no feedback or replica circuits, charge-pump 500 is simple in design and able to stabilize very quickly.

Transistors 511, 512, 521 and 522 are switching transistors that steer the current from one branch 502 to the other 504. When UP and DOWN are both low, current flows through the left sides of the branches 502 and 504, depicted by current path 1. When UP and DOWN are both high, current flows through the right sides of the branches 502 and 504, depicted by current path 2. In both cases, the net current flowing through the output is zero. When UP is high, and DOWN is low, current will flow from a current source in the bais circuit 510, through transistors 521 and 523 to charge up the loop filter 550, while the other current path is from the unity gain buffer output through transistor 512 and 514 to sink current, depicted by current path 3. The operation when DOWN is high and UP is low is just the opposite, depicted by current path 4. Transistors 513, 514, 523, and 524 are configured to always be on and to minimize and eliminate charge injection effects, hence reducing the voltage ripples in the charge-pump 500 voltage (Vcntl), thus leading to much less VCO output jitter. The op-amp 506 is used as a unity gain buffer and is configured to maintain the voltage potential of Vx and Vy to be very close to Vcntl (by 2×Vdsat) so that charge sharing effects are minimized.

Figure 6:
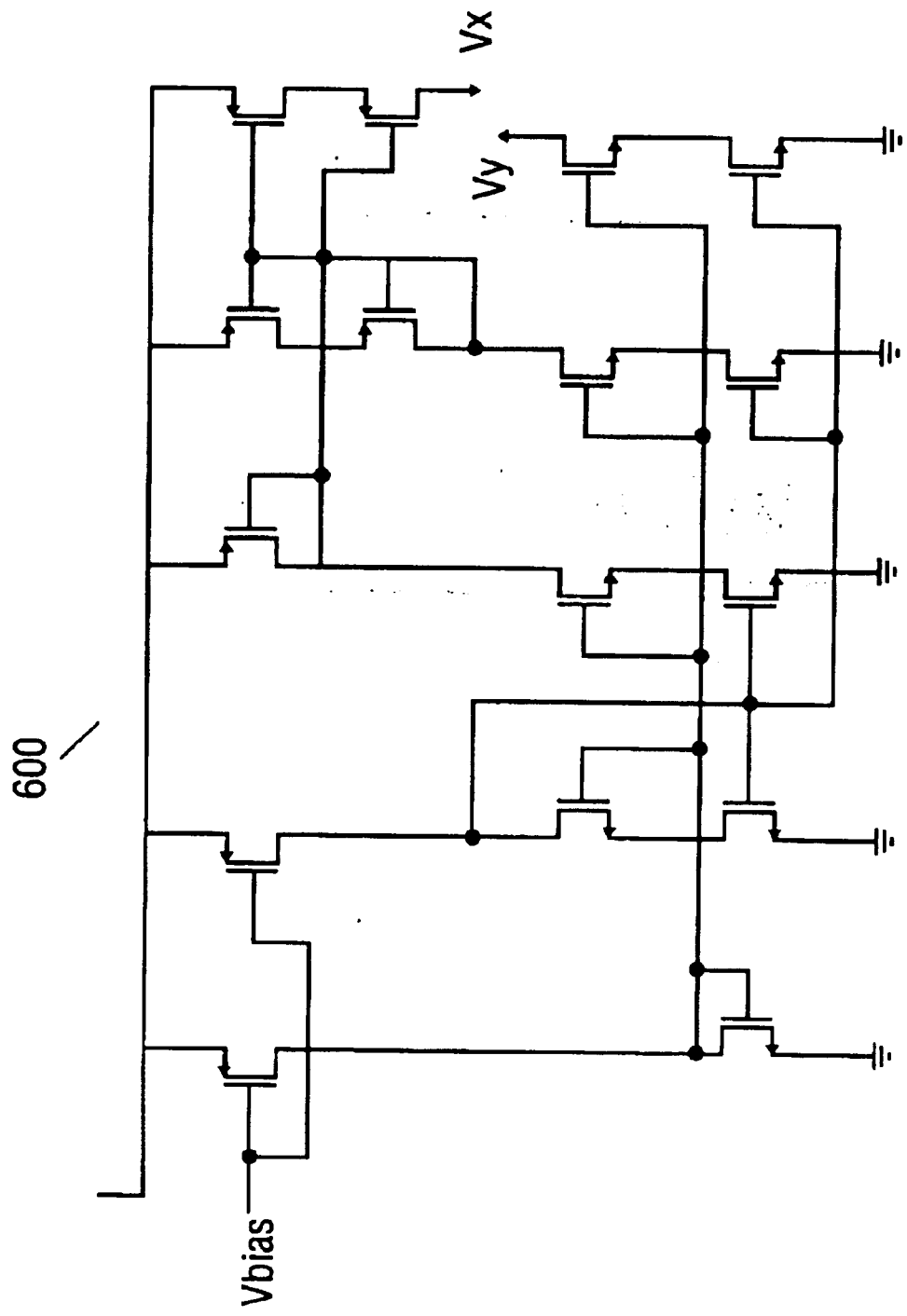
FIG. 6 is an illustration of one embodiment of a bias circuit 600 according to the present invention.

FIG. 6 is an illustration of a bias circuit 600 according to the present invention. The bias circuit 600 is implemented using a standard cascode current mirror. An advantage of the bias circuit 600 is that it has very good accuracy and wide dynamic range, and hence eliminates the need for replica or feedback circuitry. This simplifies the design, and is faster because the closed loops of replica and feedback circuit require time to stabilize, and thus should not be used for very high frequencies.

Figure 7:
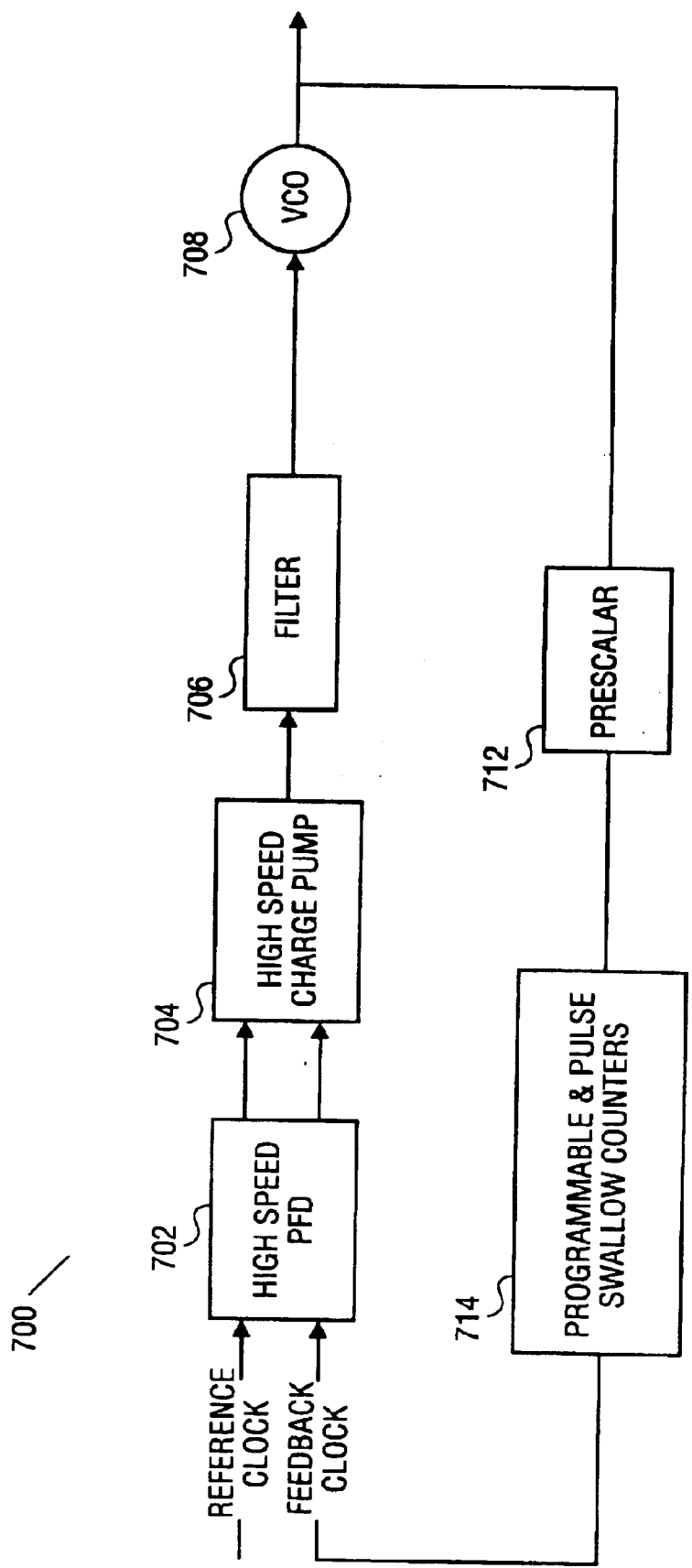
FIG. 7 is an illustration of one embodiment of a frequency synthesizer 700 configured according to the present invention.

FIG. 7 is an illustration of one embodiment of a frequency synthesizer 700 configured according to the present invention. It includes a high-speed PFD 702, a high-speed charge pump 704, a loop filter 706, a VCO 708, a prescaler device 712, and a programmable pulse swallow counter device 714. In one embodiment, the high-speed PFD 702 and the high-speed charge pump 704 are configured according to any of the embodiments of the present invention described herein. Consequently, the frequency of the Reference Clock can be very high. In one embodiment, the Reference Clock frequency is 120 MHz and the output frequency range is from 5G to 6G. Because of the advantages of the high-speed PFD 702 and the high-speed charge pump 704, the frequency synthesizer 700 has very little noise, is fast, and is simple in design.

What is claimed:

1. An apparatus, comprising:
   a phase frequency detector ("PFD") configured to detect a phase difference between a first signal and a second signal and configured to produce very narrow voltage pulses, said first and second signals having very high frequencies; and
   a charge pump, without a feedback circuit, coupled in series with the PFD and having positive and negative current branches configured to convert the very narrow voltage pulses to current pulses for correcting the phase difference between the first and second signals;
   wherein:
      the positive current branch comprises a first current path and a second current path;
      the negative current branch comprises a first current path and a second current path; and
      current flows through particular paths of the positive current branch and the negative current branch based at least in part upon the voltage pulses.

2. The apparatus of claim 1, wherein said first and second signals being up to approximately 2 GHz in frequency.

3. The apparatus of claim 1, wherein said very narrow voltage pulses are as small as 200 ps in period.

4. The apparatus of claim 1, wherein said PFD includes one or more edge triggered TSPC D flip-flops configured to have Clock to Q and Reset to Q delays of less than 100 ps.

5. A charge-pump circuit, comprising:
   a first current branch configured to generate a positive current pulse, said first current branch comprising a plurality of PMOS transistors arranged to form a first current path and a second current path;
   a second current branch configured to generate a negative current pulse, said second current branch comprising a plurality of NMOS transistors arranged to form a first current path and a second current path, and said second current branch coupled to said first current branch; and
   a bias circuit coupled to the first and second current branches with no intervening feedback circuit.

6. The charge-pump circuit of claim 5, wherein said first current branch comprises:
   first and second p-type transistors coupled together at their source terminals with a gate of the first p-type transistor coupled to receive a first voltage pulse and a gate of the second p-type transistor coupled to receive a second voltage pulse which is a logical inverse of the first voltage pulse, said first and second p-type transistors configured to steer the positive current pulse; and
   third and fourth p-type transistors with their gates coupled to ground, a source of the third p-type transistor connected to a drain of the first p-type transistor and a source of the fourth p-type transistor connected to a drain of the second p-type transistor, said third and fourth p-type transistors being always on and configured to eliminate charge injection effects.

7. The charge-pump circuit of claim 6, wherein said first and second voltage pulses are as narrow as 200 ps in period.

8. The charge pump circuit of claim 5, wherein said second current branch comprises:
   first and second n-type transistors coupled together at their source terminals with a gate of the first n-type transistor coupled to receive a third voltage pulse and a gate of the second n-type transistor coupled to receive a fourth voltage pulse which is a logical inverse of the third voltage pulse, the first n-type transistor and second n-type transistors configured to steer the negative current pulse; and
   third and fourth n-type transistors with their gates connected to a fifth voltage, a source of the third n-type transistor connected to a drain of the first n-type transistor and a source of the fourth n-type transistor connected to a drain of the second n-type transistor, and drains of the third and fourth n-type transistors connected to drains of the third and fourth p-type transistors in the upper current branch, said third and fourth n-type transistors being always on and configured to eliminate charge injection effects.

9. The charge-pump circuit of claim 8, wherein said third and fourth voltage pulses are as narrow as 200 ps in period.

10. The charge-pump of claim 5, wherein said bias circuit includes a positive current source connected to the first current branch and a negative current source connected to the lower second current branch, said positive and negative current sources configured to be continually on so as to provide negative and positive currents when in use.

11. The charge-pump of claim 5, further comprising a shorting buffer connected to the first and second current branches.

12. A high-speed PFD comprising:
   a first edge-triggered asynchronous-reset TSPC D flip-flop ("TSPC DFF") with a first input coupled to receive a reference clock signal, a second input coupled to receive a reset signal, and an output coupled to provide a first output signal;
   a second TSPC DFF with a first input coupled to receive a feedback clock signal, a second input coupled to receive a reset signal, and an output to provide a second output signal; and
   an OR gate with a first input coupled to receive the first output signal, a second input coupled to receive the second output signal, and a reset output coupled to provide the reset output signal for both the first and second TSPC DFFs;
   wherein said first and second edge-triggered CMOS D flip-flops further comprise;
      a p-precharged Domino logic gate ("p-block") having no inverting clock latch;
      an n-precharged Domino logic gate ("n-block") coupled to the p-blocks; and
      reset logic coupled to the n-block, said reset logic configured to perform asynchronous resetting.

13. The high-speed PFD of claim 12, wherein said first and second flip-flops are configured to produce output signals with periods as small as 100 ps.

14. The high-speed PFD of claim 12, wherein said reference clock signal and said feedback clock signal being up to 2 GHz in frequency.

15. The high-speed PFD of claim 12, wherein said n-block has a clock latch and wherein the reset logic is coupled to the clock latch of the n-block.

16. The high-speed PFD of claim 12, wherein the said first and second TSPC DFFs have Clock to Q and Reset to Q delays below 100 ps.

17. A frequency synthesizer, comprising:
a high-speed PFD configured to detect a phase difference between a first and second signal and generate voltage pulses; and
a charge pump, without a feedback circuit, coupled in series with the high-speed PFD, and having positive and negative current branches to convert the voltage pulses to current pulses to correct the phase difference between the first and second signals;
wherein:
the positive current branch comprises a first current path and a second current path;
the negative current branch comprises a first current path and a second current path; and
current flows through particular paths of the first current branch and the second current branch based at least in part upon the voltage pulses.

18. The frequency synthesizer of claim 17, wherein said first and second signals being up to approximately 2 GHz in frequency.

19. The frequency synthesizer of claim 17, wherein said high-speed PFD includes one or more fast edge-triggered TSPC D flip-flops configured to generate voltage pulses with a period as small as 200 ps and Clock to Q and Reset to Q delays smaller than 100 ps.

20. A charge-pump circuit, comprising:
a first current branch configured to generate a positive current pulse, said first current branch comprising a plurality of PMOS transistors;
a second current branch configured to generate a negative current pulse, said second current branch comprising a plurality of NMOS transistors, and said second current branch coupled to said first current branch; and
a bias circuit coupled to the first and second current branches with no intervening feedback circuit;
wherein said first current branch comprises:
first and second p-type transistors coupled together at their source terminals with a gate of the first p-type transistor coupled to receive a first voltage pulse and a gate of the second p-type transistor coupled to receive a second voltage pulse which is a logical inverse of the first voltage pulse, said first and second p-type transistors configured to steer the positive current pulse; and
third and fourth p-type transistors with their gates coupled to ground, a source of the third p-type transistor connected to a drain of the first p-type transistor and a source of the fourth p-type transistor connected to a drain of the second p-type transistor, said third and fourth p-type transistors being always on and configured to eliminate charge injection effects.

21. A charge-pump circuit, comprising:
a first current branch configured to generate a positive current pulse, said first current branch comprising a plurality of PMOS transistors;
a second current branch configured to generate a negative current pulse, said second current branch comprising a plurality of NMOS transistors, and said second current branch coupled to said first current branch; and
a bias circuit coupled to the first and second current branches with no intervening feedback circuit;
wherein said second current branch comprises:
first and second n-type transistors coupled together at their source terminals with a gate of the first n-type transistor coupled to receive a third voltage pulse and a gate of the second n-type transistor coupled to receive a fourth voltage pulse which is a logical inverse of the third voltage pulse, the first n-type transistor and second n-type transistors configured to steer the negative current pulse; and
third and fourth n-type transistors with their gates connected to a fifth voltage, a source of the third n-type transistor connected to a drain of the first n-type transistor and a source of the fourth n-type transistor connected to a drain of the second n-type transistor, and drains of the third and fourth n-type transistors connected to drains of the third and fourth p-type transistors in the upper current branch, said third and fourth n-type transistors being always on and configured to eliminate charge injection effects.

22. A charge-pump circuit, comprising:
a first current branch configured to generate a positive current pulse, said first current branch comprising a plurality of PMOS transistors;
a second current branch configured to generate a negative current pulse, said second current branch comprising a plurality of NMOS transistors, and said second current branch coupled to said first current branch;
a bias circuit coupled to the first and second current branches with no intervening feedback circuit; and
a shorting buffer connected to the first and second current branches.

23. A high-speed PFD comprising:
a first edge-triggered asynchronous-reset TSPC D flip-flop ("TSPC DFF") with a first input coupled to receive a reference clock signal, a second input coupled to receive a reset signal, and an output coupled to provide a first output signal;
a second TSPC DFF with a first input coupled to receive a feedback clock signal, a second input coupled to receive a reset signal, and an output to provide a second output signal; and
an OR gate with a first input coupled to receive the first output signal, a second input coupled to receive the second output signal, and a reset output coupled to provide the reset output signal for both the first and second TSPC DFFs;
wherein said first and second edge-triggered CMOS D flip-flops further comprise:
a p-precharged Domino logic gate ("p-block");
an n-precharged Domino logic gate ("n-block") coupled to the p-block and having a clock latch; and
reset logic coupled to the clock latch of the n-block, said reset logic configured to perform asynchronous resetting.

24. The high-speed PDF of claim 23, wherein the p-block has no inverting clock latch.

25. The apparatus of claim 1, wherein:
the voltage pulses comprise a first voltage pulse and a second voltage pulse;

current flows through the first current path of the positive current branch and the first current path of the negative current branch when the first voltage pulse is low and the second voltage pulse is low;

current flows through the second current path of the positive current branch and the second current path of the negative current branch when the first voltage pulse is high and the second voltage pulse is high;

current flows through the second current path of the positive current branch and the first current path of the negative current branch when the first voltage pulse is high and the second voltage pulse is low; and current flows through the first current path of the positive current branch and the second current path of the negative current branch when the first voltage pulse is low and the second voltage pulse is high.

26. The apparatus of claim 1, wherein:

the voltage pulses comprise a first voltage pulse and a second voltage pulse;

current flows through the first current path of the positive current branch when the first voltage pulse is low;

current flows through the second current path of the positive current branch when the first voltage pulse is high;

current flows through the first current path of the negative current branch when the second voltage pulse is low; and current flows through the second current path of the negative current branch when the second voltage pulse is high.

27. The charge-pump circuit of claim 5, wherein:

the first current branch receives a first voltage pulse and the second current branch receives a second voltage pulse;

current flows through the first current path of the first current branch and the first current path of the second current branch when the first voltage pulse is low and the second voltage pulse is low;

current flows through the second current path of the first current branch and the second current path of the second current branch when the first voltage pulse is high and the second voltage pulse is high;

current flows through the second current path of the first current branch and the first current path of the second current branch when the first voltage pulse is high and the second voltage pulse is low; and current flows through the first current path of the first current branch and the second current path of the second current branch when the first voltage pulse is low and the second voltage pulse is high.

28. The charge-pump circuit of claim 5, wherein:

the first current branch receives a first voltage pulse and the second current branch receives a second voltage pulse;

current flows through the first current path of the first current branch when the first voltage pulse is low;

current flows through the second current path of the first current branch when the first voltage pulse is high;

current flows through the first current path of the second current branch when the second voltage pulse is low; and current flows through the second current path of the second current branch when the second voltage pulse is high.

29. The frequency synthesizer of claim 17, wherein:

the voltage pulses comprise a first voltage pulse and a second voltage pulse;

current flows through the first current path of the positive current branch and the first current path of the negative current branch when the first voltage pulse is low and the second voltage pulse is low;

current flows through the second current path of the positive current branch and the second current path of the negative current branch when the first voltage pulse is high and the second voltage pulse is high;

current flows through the second current path of the positive current branch and the first current path of the negative current branch when the first voltage pulse is high and the second voltage pulse is low; and current flows through the first current path of the positive current branch and the second current path of the negative current branch when the first voltage pulse is low and the second voltage pulse is high.

30. The frequency synthesizer of claim 17, wherein:

the voltage pulses comprise a first voltage pulse and a second voltage pulse;

current flows through the first current path of the positive current branch when the first voltage pulse is low;

current flows through the second current path of the positive current branch when the first voltage pulse is high;

current flows through the first current path of the negative current branch when the second voltage pulse is low; and current flows through the second current path of the negative current branch when the second voltage pulse is high.

* * * * *